United States Patent

Murooka et al.

[11] Patent Number: 5,166,962
[45] Date of Patent: Nov. 24, 1992

[54] X-RAY MASK, METHOD OF MANUFACTURING THE SAME, AND EXPOSURE METHOD USING THE SAME

[75] Inventors: Ken-ichi Murooka; Masamitsu Itoh, both of Yokohama, Japan

[73] Assignee: Kabushiki Kaisha Toshiba, Kawasaki, Japan

[21] Appl. No.: 816,723

[22] Filed: Jan. 3, 1992

[30] Foreign Application Priority Data

Jan. 8, 1991 [JP] Japan .......................................... 3-733
Jul. 12, 1991 [JP] Japan .................................. 3-172733

[51] Int. Cl.$^5$ .............................................. G21K 5/00
[52] U.S. Cl. ........................................ 378/34; 378/35; 430/5
[58] Field of Search ........................ 378/34, 35; 430/5

[56] References Cited

U.S. PATENT DOCUMENTS 4,873,162 10/1989 Yoshioka et al. ........................ 430/5

FOREIGN PATENT DOCUMENTS 2-6387 1/1990 Japan .
2-6388 1/1990 Japan .

OTHER PUBLICATIONS

Appl. Phys. Lett., vol. 42, No. 5, Mar. 1, 1983, S. Nishino, et al., "Production of Large-Area Single-Crystal Wafers of Cubic SiC for Semiconductor Devices", pp. 460–462.

Primary Examiner—Constantine Hannaher
Assistant Examiner—Don Wong
Attorney, Agent, or Firm—Oblon, Spivak, McClelland, Maier & Neustadt

[57] ABSTRACT

An X-ray mask includes an X-ray transmitting thin film consisting of SiC, a W X-ray absorber formed on one surface of the thin film and having a predetermined pattern, and a support frame arranged on a peripheral portion of the thin film. The thin film is constituted by a plurality of SiC layers having different C/Si composition ratios. When the thin film is formed by a CVD method, the flow rate of a gas containing Si is fixed while a gas containing C or a diluted gas mixture of the gas containing C is changed. Consequently, the visible light transmittance of the thin film is improved.

15 Claims, 9 Drawing Sheets

X-RAY MASK, METHOD OF MANUFACTURING THE SAME, AND EXPOSURE METHOD USING THE SAME

BACKGROUND OF THE INVENTION

1. Field of the Invention

The present invention relates to an X-ray mask for use in X-ray exposure and, more particularly, to an X-ray mask in which an X-ray transmitting thin film is improved.

2. Description of the Related Art

Recently, as the degree of integration of semiconductor devices has been increased, the extent of micropatterning of a circuit pattern of LSI elements which constitute a semiconductor device has been increased. In order to form a very fine pattern on the order of so-called subhalfmicrons, high-resolution exposure transfer techniques are essential. As one of these techniques, there is proposed an exposure transfer technique using X-rays having a wavelength by far shorter than that of currently widely used ultraviolet rays. To put such an X-ray exposure transfer technique into practical use, a large number of technical problems must be solved. Of these problems, the formation of an X-ray mask is of most concern.

Figure 10:
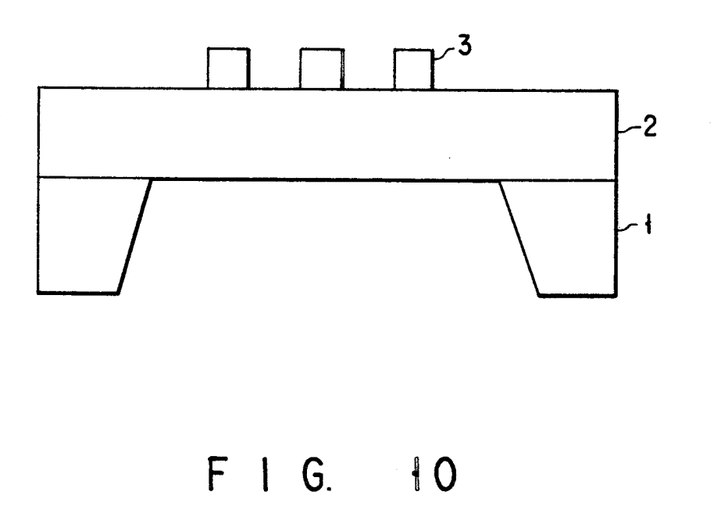
FIG. 10 is a sectional view showing the schematic arrangement of a conventional X-ray mask.
Figure 11A:
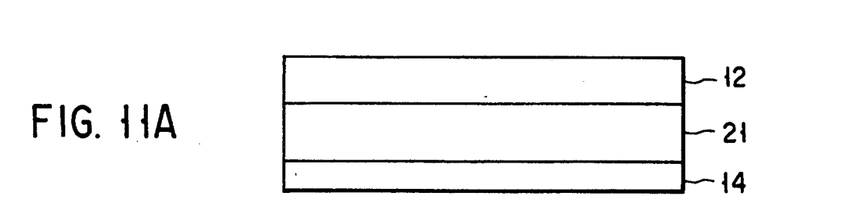
FIGS. 11A to 11D are sectional views showing a method of forming an X-ray absorber pattern and a support frame common to the above first to third embodiments in the order of steps.
Figure 11B:
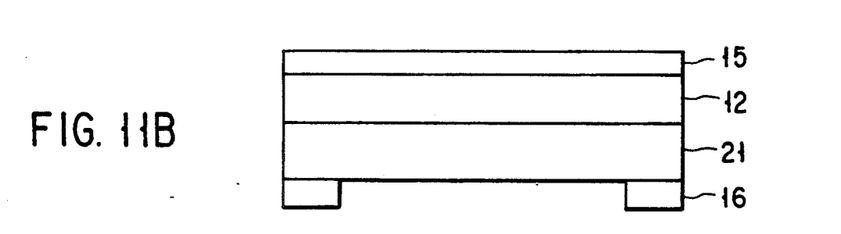
Figure 11C:
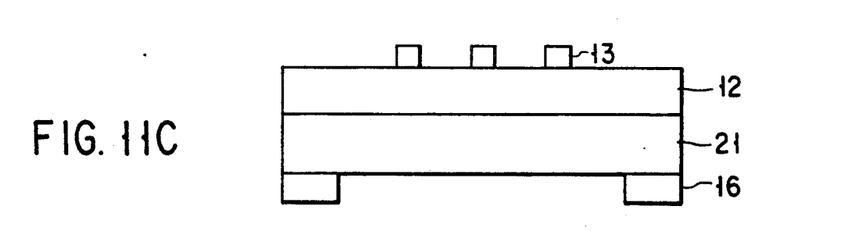
Figure 11D:
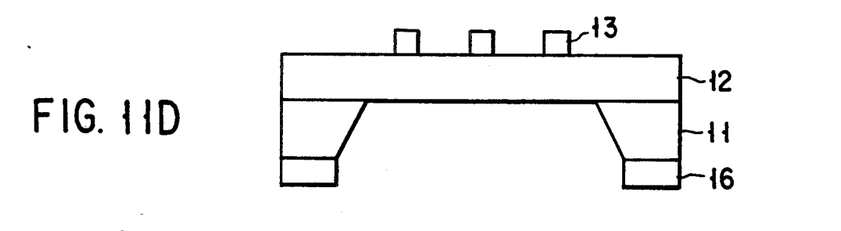

FIG. 10 shows a representative sectional structure of an X-ray mask. The main portion of this X-ray mask is composed of a support frame 1, an X-ray transmitting thin film 2 serving as a mask substrate, and an X-ray absorber pattern 3.

Of these parts, the X-ray transmitting thin film 2 is required to have a sufficient transmittance of X-rays used in exposure, a sufficient radiation resistance against intense X-rays used in exposure, and a sufficient transmittance of visible light (wavelength 633 nm) used in an alignment between a mask and a wafer. The film 2 is also required to have a sufficient mechanical strength and a small tensile stress so that a fine X-ray absorber pattern does not cause a displacement.

In many cases, the X-ray transmitting thin film 2 is formed on a substrate, such as an Si wafer, which constitutes the support frame 1. For this reason, the step of forming the film on the substrate is an important step which determines the characteristics of the X-ray transmitting thin film 2. Note that unnecessary portions of the substrate are removed by etching.

Conventionally, BN, Si, SiN, and SiC, for example, have been examined as the material of the X-ray transmitting thin film, and a vacuum vapor deposition method, a sputtering method, a CVD method, and the like have been studied as the formation method of the film. However, it is difficult to obtain a film which completely satisfies the above conditions.

For example, the use of BN or SiN makes it difficult to form a film having a sufficient radiation resistance against intense X-rays used in exposure. Although Si is satisfactory in radiation resistance, a film having a high visible light transmittance is difficult to form by using this material. SiC is a substance which satisfies the above conditions comparatively well, but it has the following problem. That is, although SiC is a material originally having a high visible light transmittance, crystal defects are easily produced upon film formation using this material, and this makes it impossible to obtain a high visible light transmittance.

In order to solve the above problems, the use of a stacked composite film consisting of two or more layers of different types of materials has been examined. In this method, however, it is necessary to use different source gases upon film formation performed by a CVD method. In addition, a technique of using different film formation methods for a single material has been studied. In this technique, for example, an amorphous film is formed by a plasma CVD or ECR-CVD method on a polycrystalline film formed by a thermal CVD method, and this composite film is used. However, this technique requires a plurality of different types of film formation apparatuses.

As described above, it is difficult to obtain a sufficiently high visible light transmittance when SiC is used as the material of the X-ray transmitting thin film. In addition, the formation of a stacked composite film proposed as the X-ray transmitting thin film complicates the manufacturing steps and makes it difficult to easily improve the visible light transmittance.

SUMMARY OF THE INVENTION

The present invention has been made in consideration of the above situation and has as its object to provide an X-ray mask having a high visible light transmittance.

It is another object of the present invention to provide a method of manufacturing an X-ray mask, which can form an X-ray transmitting thin film serving as a mask substrate by simple manufacturing steps and can improve a visible light transmittance.

It is still another object of the present invention to provide an exposure method using the X-ray mask according to the present invention.

The characteristic feature of the X-ray mask according to the present invention is that the overall visible light transmittance is improved by constituting an X-ray transmitting thin film serving as a mask substrate by a stacked film consisting of layers having different compositions. In addition, in order to form this stacked film, the film formation is performed under different film formation conditions in a CVD method.

Suppose the film formation of SiC is performed by a CVD method under conditions in which the ratio of C atoms to Si atoms contained in source gases is changed. In this case, when the ratio is small, each crystal grain has high quality and the film has a high visible light transmittance. However, since unevenness in grain boundaries or on a film surface is enlarged, light is scattered on the surface of the film to cause the visible light transmittance to decrease. When the ratio is large, on the other hand, light is less scattered because unevenness in grain boundaries or on a film surface is small. However, since an inclusion which absorbs light is mixed in the film, the visible light transmittance decreases.

For this reason, by stacking a plurality of layers having different ratios of C atoms to Si atoms, it is possible to form a good X-ray transmitting thin film having advantages of the respective layers. For example, both the major surfaces of an X-ray transmitting thin film are formed under a condition in which the ratio of C atoms to Si atoms is more (as compared with an average value of the entire thin film), whereas the central portion of the film is formed under a condition in which the ratio of C atoms to Si atoms is less. In this case, a good thin film having small undulations on its surface and containing a little inclusion which absorbs light can be obtained.

In addition, according to the present invention, a desired X-ray transmitting thin film can be formed by properly selecting the flow rate of a source gas during film formation. Therefore, an X-ray transmitting thin film can be easily formed in a single reactor. Furthermore, since an X-ray transmitting thin film having a high visible light transmittance is realized, an alignment between a mask and a wafer can be performed with a high precision.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Figure 1:
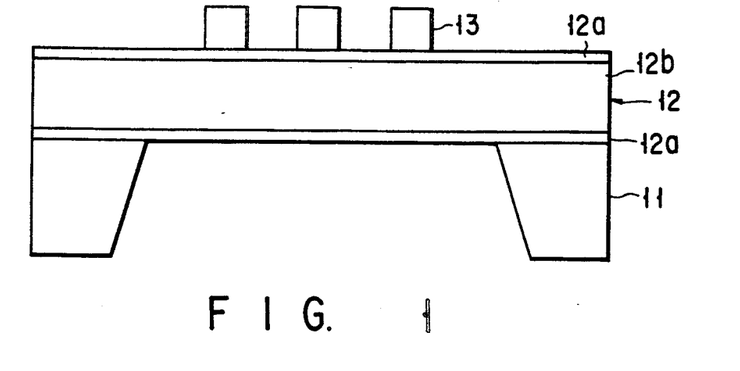
FIG. 1 is a sectional view showing the schematic arrangement of an X-ray mask according to the first embodiment of the present invention.

FIG. 1 is a sectional view showing the schematic arrangement of an X-ray mask according to the first embodiment of the present invention. Referring to FIG. 1, reference numeral 11 denotes a partially etched support frame of Si or the like; 12, an X-ray transmitting thin film serving as a mask substrate consisting of SiC; and 13, an X-ray absorber pattern consisting of tungsten or the like. The arrangement of this embodiment is basically identical to that of a conventional example shown in FIG. 10 except that the X-ray transmitting thin film 12 has a three-layered structure of 12a-12b-12a.

Figure 2:
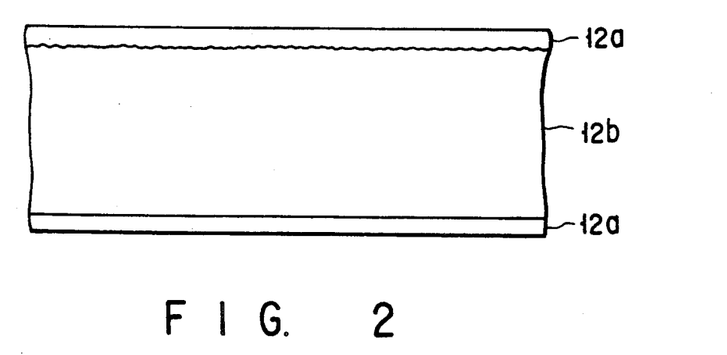
FIG. 2 is an enlarged sectional view showing an X-ray transmitting thin film used in the X-ray mask of FIG. 1.

FIG. 2 shows the section of the X-ray transmitting thin film 12 in an enlarged scale. Referring to FIG. 2, a 1-$\mu$m thick SiC film is formed on an Si substrate through a low pressure CVD method, and the ratio of C to Si in two surface portions 12a of the film is larger than that in a central portion 12b.

Figure 3:
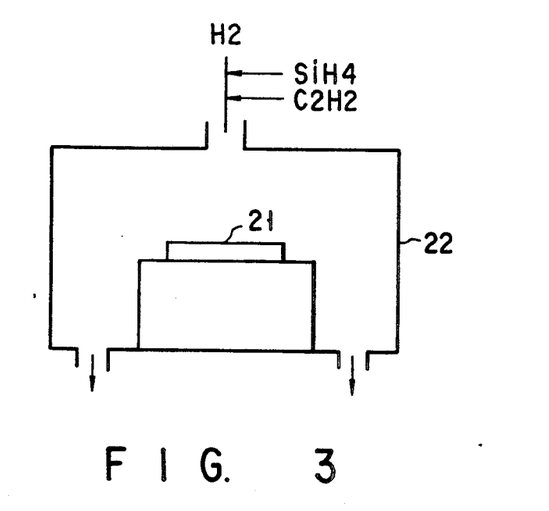
FIG. 3 is a schematic view showing an example of an apparatus for manufacturing the X-ray transmitting thin film.

More specifically, as shown in FIG. 3, while source gases were introduced into a reactor 22 containing an Si substrate 21 (support frame 11), the 1 $\mu$m thick SiC film 12 was formed on the Si (100) substrate 21, which was heated xto 1,050° C. beforehand. The internal pressure of the reactor 22 was set at 1 kPa. Note that the CVD apparatus is not limited to that of FIG. 3 but may be an apparatus using a reaction tube.

The gases used were silane (concentration 3%, hydrogen diluted), acetylene (concentration 10%, hydrogen diluted), and hydrogen. The flow rate of silane was fixed at 67 sccm, and that of hydrogen was fixed at 500 sccm. In the thin film 12 shown in FIG. 2, each portion 12a was formed at an acetylene flow rate of 10 sccm for three minutes, and the portion 12b was formed at an acetylene flow rate of 9 sccm for 39 minutes.

Note that a 0.7-$\mu$m thick SiC film 14 was also formed on the lower surface of the Si substrate 21 through a low pressure CVD method at a pressure of 1 kPa, a substrate temperature of 1,050° C., a silane flow rate of 100 sccm, an acetylene flow rate of 30 sccm, and a hydrogen flow rate of 450 sccm. Portions except for a 25-mm square region in the central portion of the SiC film on its lower surface were covered with an aluminum etching mask, and the SiC film in the remaining portion was removed by reactive ion etching at an RF applied power of 300 W by using a gas mixture of 25 sccm of carbon tetrafluoride and 20 sccm of oxygen. Subsequently, a portion 16 of the remaining SiC film was used as an etching mask to etch away the Si substrate 21 exposed on the lower surface by using an aqueous 30% solution of potassium hydroxide at about 90° C., thereby forming the support frame 11 described above.

The visible light transmittance of the 25-mm square SiC film 12 of the completed mask, which remained in the form of a thin film, was measured by using a spectrophotometer.

With the above method, a film having a visible light transmittance of 42% at a wavelength of 633 nm could be obtained. By contrast, the visible light transmittance of a 1-$\mu$m thick SiC film formed with the flow rates of silane, acetylene, and hydrogen fixed as in conventional methods is at most 33% for an acetylene flow rate of 10 sccm and 38% for that of 9 sccm.

That is, according to this embodiment, it is found that the visible light transmittance can be improved by 10% or more simply by changing the gas flow rate (acetylene) by about 10% during the film formation. In addition, a satisfactory effect could be obtained from the thin film 12 shown in FIG. 2 even when only one portion 12a was formed.

As described above, according to this embodiment, the visible light transmittance of the X-ray transmitting thin film 12 serving as a mask substrate can be increased by forming the X-ray transmitting thin film 12 using a stacked film consisting of layers having slightly different compositions of SiC. In this case, since the X-ray transmitting thin film 12 consists of the same material system, the film can be easily formed in a single reactor only by changing the flow rates of source gases in a CVD method. In addition, when an X-ray mask is formed by using this X-ray transmitting thin film 12, an alignment between the mask and a wafer can be performed with a high precision. This makes it possible to realize an X-ray mask which is essential in putting micropatterning of VLSI elements of the next generation using X-ray exposure transfer techniques into practical use.

Figure 4:
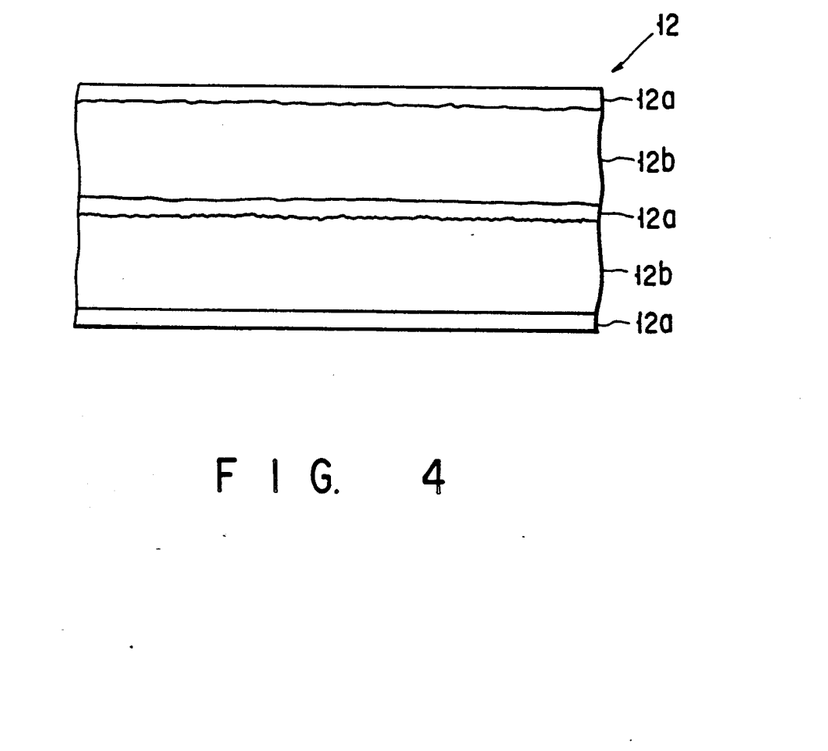
FIG. 4 is a sectional view showing an X-ray transmitting thin film according to the second embodiment of the present invention.

FIG. 4 is a sectional view showing the section of an X-ray transmitting thin film according to the second embodiment of the present invention in an enlarged scale. In this embodiment, a film 12a was also formed in a middle portion of the film 12b previously shown in FIG. 3 at an acetylene flow rate of 10 sccm for three minutes. The other conditions including the entire film thickness of this second embodiment were the same as those of the above first embodiment.

Also in this case, as in the first embodiment, an SiC film was also formed on the lower surface and selectively etched, and the remaining SiC film was used as a mask to etch away the Si substrate exposed on the lower surface. The visible light transmittance of a 25-mm square SiC film remaining in the form of a thin film was measured by using a spectrophotometer.

With the above method, a film having a visible light transmittance of 48% at a wavelength of 633 nm could be obtained. This embodiment is different from the above first embodiment only in that the acetylene flow rate was varied from 9 sccm to 10 sccm in the middle portion. However, the visible light transmittance could be improved by 6% compared with that of the first embodiment.

Figure 5:
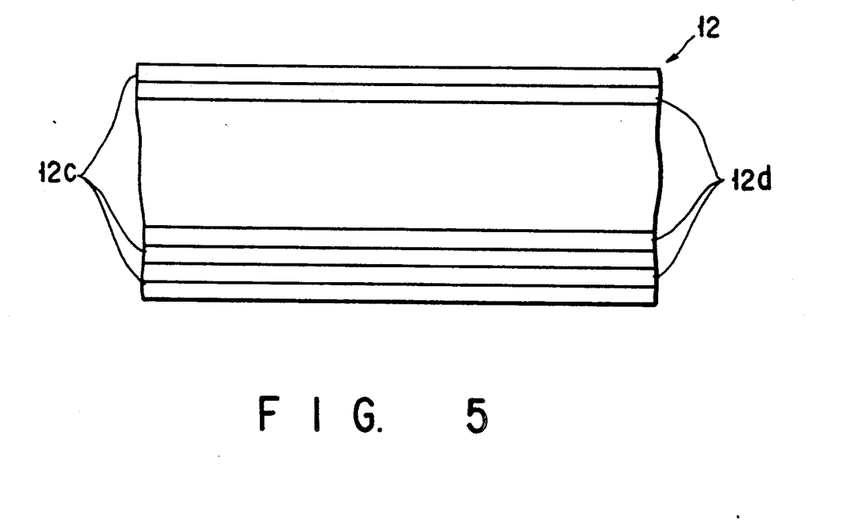
FIG. 5 is a sectional view showing an X-ray transmitting thin film according to the third embodiment of the present invention.

FIG. 5 is a sectional view showing the section of an X-ray transmitting thin film according to the third embodiment of the present invention in an enlarged scale. Also in this embodiment, a low pressure CVD method was used to form a 1-μm thick SiC film on an Si substrate with a plane index of (100), which was heated to 1,050° C. at a pressure of 1 kPa, and a plurality of layers having different compositions were stacked in this film.

As in the first embodiment, the gases used were silane (concentration 3%, hydrogen diluted), acetylene (concentration 10%, hydrogen diluted), and hydrogen. While the flow rates of silane and hydrogen were fixed at 67 sccm and 500 sccm, respectively, the film formation was alternately performed at acetylene flow rates of 9.5 sccm and 8 sccm for three minutes each and for a total of 45 minutes such that the uppermost layer and the lowest layer were formed at a flow rate of 9.5 sccm. In the SiC film 12, films 12c were formed at an acetylene flow rate of 9.5 sccm, and films 12d were formed at that of 8 sccm.

Also in this case, as in the first embodiment described above, an SiC film was also formed on the lower surface and selectively etched, and the remaining SiC film was used as a mask to etch away the Si substrate exposed on the lower surface. Thereafter, the visible light transmittance of a 25-mm square SiC film remaining in the form of a thin film was measured by using a spectrophotometer.

With the above method, a film having a visible light transmittance of 68% at a wavelength of 633 nm could be obtained. This value of visible light transmittance belongs to the highest class among those of usual SiC masks obtained before coated with an antireflection film. That is, according to this embodiment, it is found that the visible light transmittance can be largely improved by 70% or more simply by changing the gas flow rate by about 20% during the film formation. In addition, a higher visible light transmittance can be naturally obtained when an antireflection film consisting of, e.g., silicon oxide, is formed on this film.

FIGS. 11A to 11D are views showing a method of forming the X-ray absorber pattern 13 and the support frame 11 common to the above first to third embodiments in the order of steps.

First, in accordance with the manufacturing steps described above, an X-ray transmitting thin film 12 having a layer structure according to any of the first to third embodiments is formed on an Si substrate 21. Subsequently, the SiC film 14 is formed on the lower surface of the substrate 21, and the central portion of the SiC film 14 is removed by reactive ion etching. A tungsten (W) film 15 serving as an X-ray absorber is formed on the surface of the SiC film 12 by a sputtering method. A resist is coated on the W film 15, and a predetermined pattern is formed on the resist by using an electron beam writing apparatus. The resultant resist is used as an etching mask to transfer the pattern of the resist onto the W film 15 by reactive ion etching, and the remaining resist is removed to form an X-ray absorber pattern 13. Lastly, a residual portion 16 of the SiC film 14 on the lower surface side of the substrate 21 is used as a mask to etch away the exposed portion of the substrate 21, thereby forming the support frame 11. Detailed conditions for forming the support frame 11 are as described above.

Figure 12:
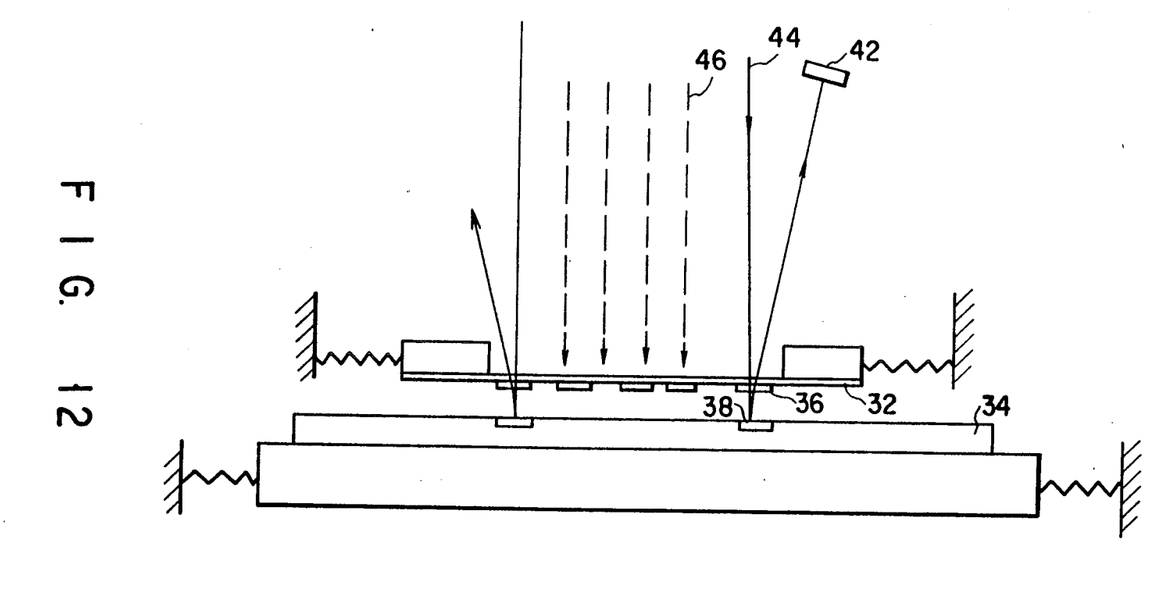
FIG. 12 is a view for explaining an exposure method using the X-ray mask according to the present invention common to the above first to third embodiments.

FIG. 12 is a view for explaining an exposure method using the X-ray mask according to the present invention common to the first to third embodiments.

The manufacture of a semiconductor device requires transfer of several different patterns. Therefore, in order to perform relative positioning between the respective patterns, it is necessary to align a mask 32 and a wafer 34 with a high precision. In the present invention, a diffraction grating-like alignment mark 36 formed on the peripheral portion of the circuit pattern on the mask 32 by using the same material W as the X-ray absorber and a diffraction grating-like alignment mark 38 (essentially the same pattern as the mark 36) formed beforehand on the wafer are used to perform alignment for the gap and the horizontal relative position between the mask 32 and the wafer 34 through a heterodyne method using an He-Ne laser beam (wavelength 633 nm).

As shown in FIG. 12, a laser beam 44 including information concerning the alignment between the mask 32 and the wafer 34 reaches a detector 42 after passing through the mask substrate twice. Therefore, the S/N ratio of a signal can be largely improved by using the mask substrate having a high visible light transmittance, and this enables a highly precise alignment. An X-ray resist is spin-coated on the wafer 34 beforehand, and X rays 46 having a wavelength of about 1 nm are radiated from the upper portion of the drawing surface while a feedback operation for the alignment is performed, thereby performing transfer. After the transfer, the resist is developed with an proper developer to form a resist pattern. This resist pattern is used to process an underlying substrate, thus making it possible to manufacture a semiconductor device with a fine pattern.

Note that the present invention is not limited to the above embodiments. In each of the above embodiments, the film formation of SiC is performed using silane, acetylene, and hydrogen. However, the same effect can be obtained by using other gases, for example, gases containing Si atom, such as dichlorosilane, trichlorosilane, tetrachlorosilane, silicon tetrafluoride, and disilane, and gas mixtures of these gases, in place of silane; and gases containing C atom, such as methane, ethane, ethylene, and propane, and gas mixtures of these gases, in place of acetylene.

In addition, the same effect can be obtained when not only the flow rates of acetylene and hydrogen used to dilute the acetylene but also the flow rate of another gas, such as silane, is simultaneously changed. Conversely, the same effect can be obtained when the flow rate of only one type of gas is varied by using a non-diluted gas.

Furthermore, when gases containing halogen groups, such as fluorine, chlorine, and hydrogen chloride, are introduced into a reactor during the film formation, the same effect as when the ratio of C atoms to Si atoms in the source gases is changed can be obtained. This is so because the reactivity and the rate of reaction of the above gases with respect to Si atoms being deposited or the source gas of Si atoms are different from those with respect to C atoms being deposited or the source gas of C atoms. For this reason, by changing the flow rates of the gases containing halogen groups, such as fluorine, chlorine, and hydrogen chloride, during the film formation, the visible light transmittance can be improved as in the above embodiments.

This effect of introducing gases containing halogen groups will be described below. A low pressure CVD apparatus was used in the film formation of SiC, and an Si(100) wafer of 3 inches in diameter was used as a substrate. This wafer was not subjected to any special pretreatment after it was purchased but directly placed on an SiC-coated graphite susceptor in the apparatus. The setting of substrate temperature was performed by induction-heating the substrate by using a radio frequency from outside a bell jar. The substrate temperature was measured by using a pyrometer from outside the bell jar, and the film formation was performed at 1,050° C.

1% Hydrogen-diluted silane ($SiH_4$) and 1% hydrogen-diluted acetylene ($C_2H_2$) were used as source gases, hydrogen ($H_2$) was used as a carrier gas, and hydrogen chloride gas (HCl) was added as described above. The flow rate of each gas was controlled by a mass-flow controller. These gases were exhausted by a dry pump with an exhaust power of 7,000 l/min via an automatic pressure regulating valve interlocked with a capacitance absolute manometer.

In order to change the source gas composition ratio, the flow rate of the acetylene gas was changed while the flow rate of the diluted silane gas was fixed at 300 sccm. At this time, the flow rate of the hydrogen gas was simultaneously changed so that the total gas flow rate was kept constant at 580 sccm. The pressure was set at 1 kPa upon film formation. The film thickness was measured by observing the section by using an SEM after the film formation.

Figure 6:
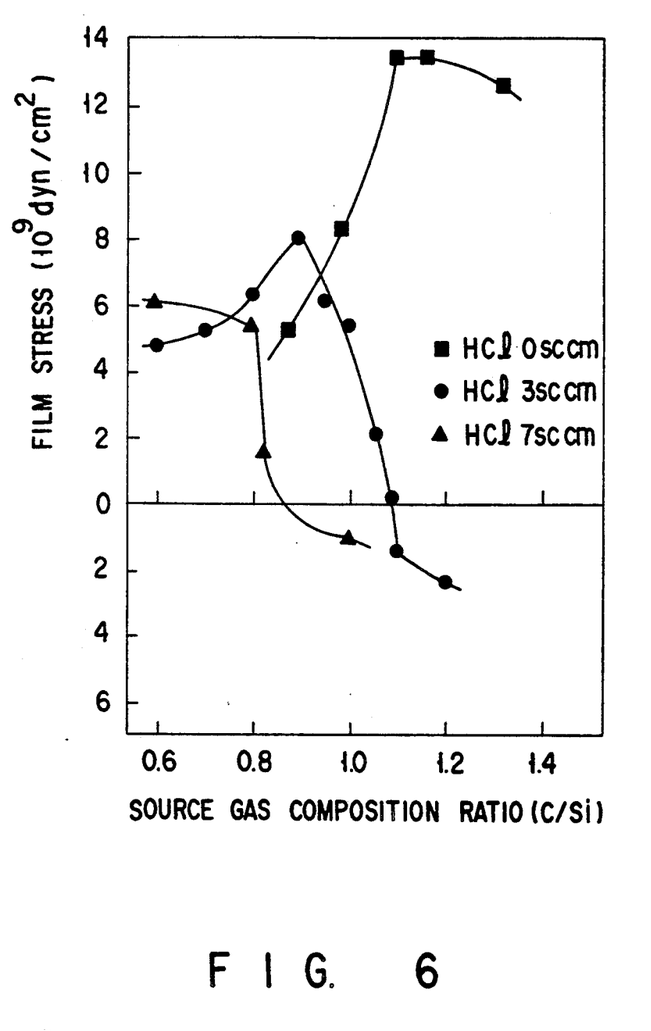
FIG. 6 is a graph showing the change in film stress as a function of the source gas composition ratio.

FIG. 6 is a graph showing the change in film stress as a function of the source gas composition ratio (C/Si). The stress measurement was performed by preparing a substrate whose initial deflection or warp was measured in advance by using a flatness tester before the film formation, and calculating from the difference between the initial warp and the warp of the substrate after the film formation in accordance with the balancing conditions of an elastic material.

FIG. 6 reveals that a tensile stress of about $1 \times 10^9$ $dyn/cm^2$, which is a desirable value as the stress of an SiC film, can be obtained by addition of HCl; that is, C/Si=1.1 when HCl=3 sccm, and C/Si=0.8 when HCl=7 sccm. When the addition amount of HCl is increased, the peak value of the curve is shifted in the direction along which the C/Si value decreases. The reason for this is that because HCl reacts with Si more strongly than with C, the effective source gas composition ratio on the surface becomes equivalent to that when the C/Si ratio is large.

Figure 7:
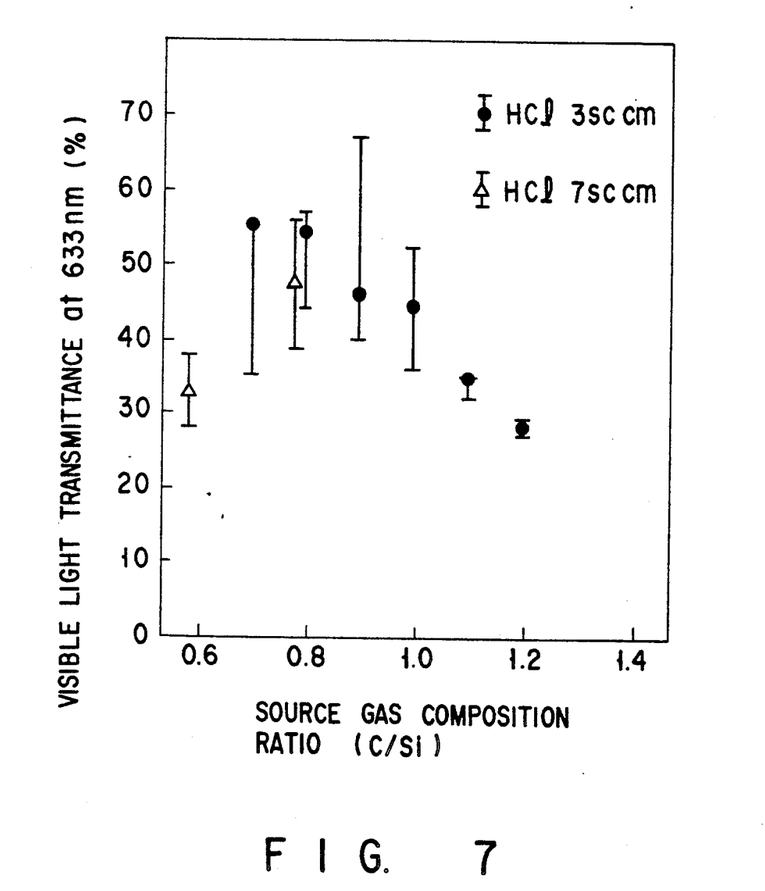
FIG. 7 is a graph showing the change in visible light transmittance as a function of the source gas composition ratio.

FIG. 7 is a graph showing the change in visible light transmittance as the function of the source gas composition ratio (C/Si). The measurement of the visible light transmittance was performed by using a sample with a film thickness of 1.0 μm. Referring to FIG. 7, each bar of data indicates a transmittance which can be obtained by changes in film thickness.

The measurement of the visible light transmittance was performed as follows. First, an SiC film was also formed on the lower surface of a substrate, and only a central 25-mm square region of the film on the lower surface was removed by reactive ion etching using a gas mixture of carbon tetrafluoride ($CF_4$) and oxygen ($O_2$). Subsequently, a portion of the Si substrate exposed on the lower surface was removed by etching with an aqueous potassium hydroxide (KOH) solution at about 90° C. Thereafter, the visible light transmittance of the central 25-mm square region of the SiC film remaining in the form of a membrane was measured by a spectrophotometer.

As can be seen from FIG. 7, a visible light transmittance of 50% or more, which is desirable as a mask substrate, can be easily obtained by addition of HCl (C/Si=0.7 to 1.0). Especially when the HCl flow rate was 7 sccm and the source gas composition ratio was about 0.8, it is possible to simultaneously achieve the optimum stress described above and the desirable visible light transmittance of 50% or more.

Figure 8:
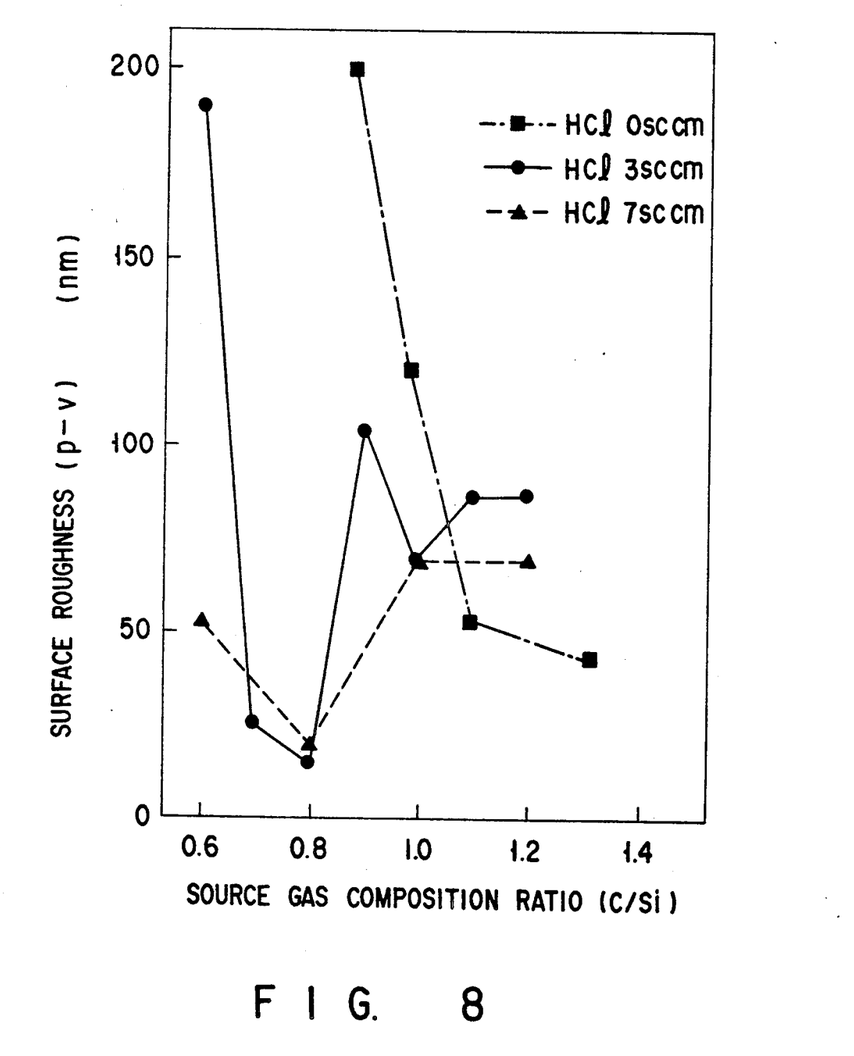
FIG. 8 is a graph showing the change in surface roughness as a function of the source gas composition ratio.

When the surface roughness with respect to the source gas composition ratio (C/Si) was measured, the results shown in FIG. 8 were obtained. FIG. 8 reveals that an SiC film with a small surface roughness can be formed by addition of HCl (C/Si=0.7 to 0.8). In particular, a film having a surface roughness of about 15 nm can be obtained by adding 3 sccm of HCl and performing film formation at a composition ratio of C/Si=0.8. A film having a surface roughness of about 20 nm could be obtained even under the film formation conditions (HCl=7 sccm, C/Si=0.8) which satisfy the standard levels of both the stress and the visible light transmittance described above.

Figure 9:
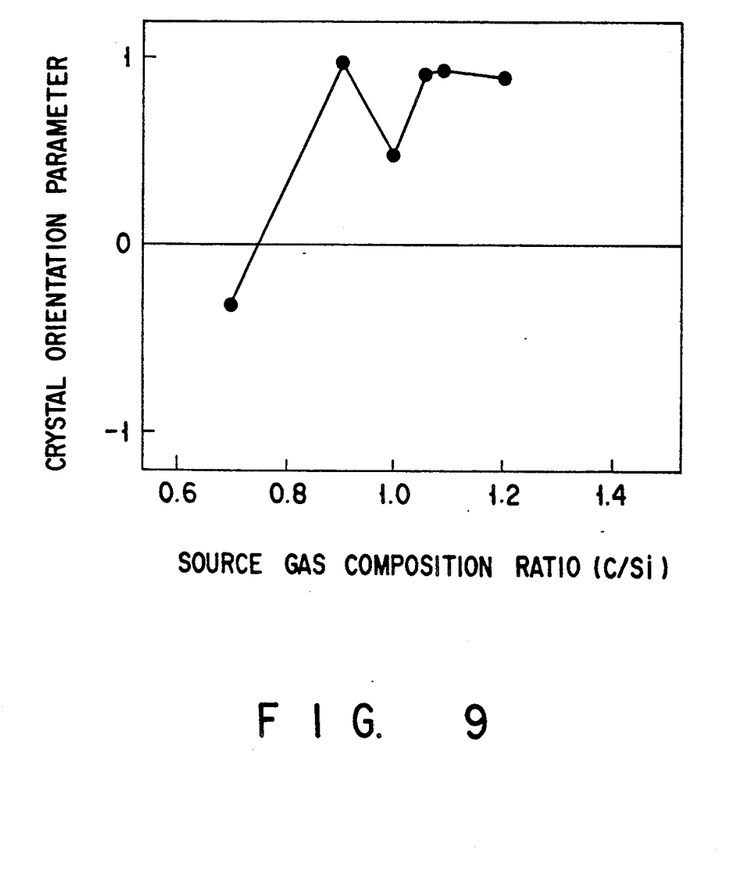
FIG. 9 is a graph showing the change in crystal orientation parameter as a function of the source gas composition ratio.

FIG. 9 is a graph showing the crystal orientation parameter as a function of the source gas composition ratio (C/Si). The HCl flow rate was set at 3 sccm, and the crystal orientation parameter was defined as $$\{I_{(111)} - I_{(200)}\} / \{I_{(111)} + I_{(200)}\}$$

in accordance with an X-ray diffraction peak strength. As is apparent from FIGS. 8 and 9, this parameter has a correlation with the surface roughness. From this fact, it is understood that in order to obtain a film with a small surface roughness, a film having an intense (200)

reflection, i.e., a strong <100> orientation property need only be formed.

The effect of improving the visible light transmittance obtained by introducing the halogen group can be obtained by using an additional impurity source gas such as arsine, phosphine, or diborane as well. That is, each of these impurities As, P, and B, for example, has different substitution reaction properties and different rates of reaction with respect to an Si atom and a C atom. Therefore, it can be expected that an effect equivalent to that obtained by changing the ratio of C atoms to Si atoms in source gases can be obtained by changing the flow rate of a source gas of the above impurity as in a case wherein the gas containing the halogen group is used.

In the above embodiments, SiC is used as the material of an X-ray transmitting thin film formed as a mask substrate. However, the present invention is also effective when another material, e.g., BN or SiN is used as the film. In addition, the film formation method is not limited to a low pressure CVD method but may be an atmospheric pressure CVD method, a plasma CVD method, an ECR-CVD method, a photo excited CVD method, and the like. Furthermore, the present invention can be variously modified without departing from the spirit and scope of the present invention.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. An X-ray mask comprising:
   an X-ray transmitting substrate having a structure in which a plurality of different layers consisting of a same material and having different compositions are stacked;
   an X-ray absorber formed on one surface of said substrate and having a predetermined pattern; and
   a support frame arranged on a peripheral portion of said substrate.

2. A mask according to claim 1, wherein said substrate is constituted by a plurality of SiC layers having different C/Si composition ratios.

3. A mask according to claim 2, wherein said substrate comprises surface layers formed on both the outermost portions of said substrate, and the ratio of C to Si in said surface layers is larger than the ratio of C to Si in the entire substrate.

4. A mask according to claim 3, wherein said substrate comprises a single central layer sandwiched between said surface layers, and the ratio of C to Si in said surface layers is larger than the ratio of C to Si in said central layer.

5. A method of manufacturing an X-ray mask, comprising the steps of:
   forming an X-ray transmitting substrate by a CVD method while changing the flow rate of at least one type of a gas of gases used during the film formation so that said X-ray transmitting substrate has a structure in which a plurality of different layers consisting of a same material and having different compositions are stacked;
   forming an X-ray absorber having a predetermined pattern on one surface of said substrate; and
   forming a support frame on a peripheral portion of said substrate.

6. A method according to claim 5, wherein said substrate consists of SiC formed by using a first gas containing Si and a second gas containing C.

7. A method according to claim 6, wherein during the substrate formation, the flow rate of said first gas is fixed while the flow rate of said second gas or a diluted gas mixture of said second gas is changed.

8. A method according to claim 7, wherein said substrate comprises surface layers formed on both the outermost portions of said substrate, and the formation of said surface layers is performed essentially by increasing the flow rate of said second gas.

9. A method according to claim 6, wherein during the substrate formation, the flow rate of said second gas is fixed while the flow rate of said first gas or a diluted gas mixture of said first gas is changed.

10. A method according to claim 9, wherein said substrate comprises surface layers formed on both the outermost portions of said substrate, and the formation of said surface layers is performed essentially by decreasing the flow rate of said first gas.

11. A method according to claim 6, wherein said first ga comprises one material selected from the group consisting of silane, dichlorosilane, trichlorosilane, tetrachlorosilane, silicon tetrafluoride, and disilane, and said second gas comprises one material selected from the group consisting of methane, ethane, ethylene, acetylene, and propane.

12. A method according to claim 6, wherein a third gas comprising one material selected from the group consisting of arsine, phosphine, fluorine, chlorine, hydrogen chloride, and diborane is used together with said first and second gases during the substrate formation.

13. An exposure method using an X-ray mask comprising:
   an X-ray transmitting substrate having a structure in which a plurality of different layers consisting of a same material and having different compositions are stacked,
   an X-ray absorber formed on one surface of said substrate and having a predetermined pattern, and
   a support frame arranged on a peripheral portion of said substrate, comprising the steps of:
   forming a first alignment mark on said substrate by using the same material as said X-ray absorber;
   forming a second alignment mark on a wafer, said second mark having a pattern corresponding to said first mark;
   coating an X-ray resist on said wafer;
   arranging said mask above said wafer such that said first and second marks are substantially aligned with each other;
   radiating visible light onto a region including said second mark of said wafer through a region including said first mark of said wafer, and aligning the positions of said mask and said wafer with each other while detecting reflected light;
   radiating X-rays onto said resist on said wafer through said mask after the alignment between said mask and said wafer, thereby transferring said X-ray absorber pattern of said mask;
   developing the transferred resist to form a resist pattern; and
   processing said wafer by using said resist pattern.

14. A method according to claim 13, wherein the visible light is laser light.

15. A method according to claim 13, wherein the first and second marks are diffraction grating-like marks.

* * * * *